United States Patent
Weigold

(10) Patent No.: US 8,828,773 B2
(45) Date of Patent: Sep. 9, 2014

(54) PROCESS OF FORMING A MICROPHONE USING SUPPORT MEMBER

(71) Applicant: Invensense, Inc., San Jose, CA (US)

(72) Inventor: Jason W. Weigold, Newburyport, MA (US)

(73) Assignee: Invensense, Inc., San Jose, CA (US)

( * ) Notice: Subject to any disclaimer, the term of this patent is extended or adjusted under 35 U.S.C. 154(b) by 0 days.

(21) Appl. No.: 13/669,857

(22) Filed: Nov. 6, 2012

(65) Prior Publication Data

US 2013/0065344 A1   Mar. 14, 2013

Related U.S. Application Data

(63) Continuation of application No. 12/244,840, filed on Oct. 3, 2008, now Pat. No. 8,309,386, which is a continuation of application No. 11/613,003, filed on Dec. 19, 2006, now Pat. No. 7,449,356, which is a continuation-in-part of application No. 11/113,925, filed on Apr. 25, 2005, now Pat. No. 7,825,484.

(60) Provisional application No. 60/754,984, filed on Dec. 29, 2005.

(51) Int. Cl.
   *H01L 21/00*   (2006.01)

(52) U.S. Cl.
   USPC .................................... 438/53; 257/E21.002

(58) Field of Classification Search
   USPC ........ 438/50, 52, 53, 108; 257/414–416, 418, 257/419, 420, E21.002; 381/174, 175
   See application file for complete search history.

(56) References Cited

U.S. PATENT DOCUMENTS

| | | | |
|---|---|---|---|
| 7,329,933 B2 * | 2/2008 | Zhe et al. | 257/419 |
| 7,536,769 B2 * | 5/2009 | Pedersen | 29/594 |
| 2003/0133588 A1 * | 7/2003 | Pedersen | 381/423 |
| 2006/0093171 A1 * | 5/2006 | Zhe et al. | 381/191 |
| 2006/0210106 A1 * | 9/2006 | Pedersen | 381/355 |

* cited by examiner

*Primary Examiner* — Daniel Luke
*Assistant Examiner* — Latanya N Crawford
(74) *Attorney, Agent, or Firm* — Maryam Imam; IPxLaw Group LLP

(57) ABSTRACT

A method of forming a microphone forms a backplate, and a flexible diaphragm on at least a portion of a wet etch removable sacrificial layer. The method adds a wet etch resistant material, where a portion of the wet etch resistant material is positioned between the diaphragm and the backplate to support the diaphragm. Some of the wet etch resistant material is not positioned between the diaphragm and backplate. The method then removes the sacrificial material before removing any of the wet etch resistant material added during the prior noted act of adding. The wet etch resistant material then is removed substantially in its entirety after removing at least part of the sacrificial material.

19 Claims, 8 Drawing Sheets

PROCESS OF FORMING A MICROPHONE USING SUPPORT MEMBER

PRIORITY

This patent application claims priority from provisional U.S. patent application No. 60/754,984, filed Dec. 29, 2005, entitled, " PROCESS OF FORMING A MICROPHONE USING SUPPORT MEMBER," and naming Jason Weigold as inventor, the disclosure of which is incorporated herein, in its entirety, by reference, and is a continuation of U.S. patent application Ser. No. 12/244,840, filed Oct. 3, 2008, entitled, "PROCESS OF FORMING A MICROPHONE USING SUPPORT MEMBER ," and naming Jason Weigold as inventor, the disclosure of which is incorporated herein, in its entirety, by reference, and also claims priority from U.S. patent application Ser. No. 11/613,003, filed Dec. 19, 2006, entitled, "PROCESS OF FORMING A MICROPHONE USING SUPPORT MEMBER," and naming Jason Weigold as inventor, the disclosure of which is incorporated herein, in its entirety, by reference.

This patent application also claims priority from U.S. patent application Ser. No. 11/113,925, filed Apr. 25, 2005, now U.S. Pat. No. 7,825,484, issued Nov. 2, 2010 and entitled, " MICROMACHINED MICROPHONE AND MULTISENSOR AND METHOD FOR PRODUCING SAME ," and naming John R. Martin, Timothy J. Brosnihan, Craig Core, Thomas Kieran Nunan, Jason Weigold, and Zin Zhang as inventors, the disclosure of which is incorporated herein, in its entirety, by reference.

FIELD OF THE INVENTION

The invention generally relates to microphones and, more particularly, the invention relates to methods for forming microphones.

BACKGROUND OF THE INVENTION

Some processes form microphones, such as MEMS microphones, by depositing a diaphragm material onto a sacrificial material that ultimately is removed by wet etching processes. Problems arise, however, when the surface tension of the liquid etchant causes the diaphragm to stick to its corresponding backplate. See U.S. Pat. No. 5,314,572 for an example of one method discussed for use with inertial sensors.

SUMMARY OF THE INVENTION

In accordance with one aspect of the invention, a method of forming a microphone forms a backplate, and a flexible diaphragm on at least a portion of a wet etch removable sacrificial layer. The method adds a wet etch resistant material, where a portion of the wet etch resistant material is positioned between the diaphragm and the backplate to support the diaphragm. Some of the wet etch resistant material is not positioned between the diaphragm and backplate. The method then removes the sacrificial material before removing any of the wet etch resistant material added during the prior noted act of adding. The wet etch resistant material then is removed substantially in its entirety after removing at least part of the sacrificial material.

Some embodiments release the diaphragm, which involves removing the sacrificial material and removing the wet etch resistant material. In some embodiments, the wet etch resistant material comprises a photoresist material. Moreover, the wet etch resistant material may be removed by application of a dry etch. It should be noted that the act of forming a flexible diaphragm may include a number of different things. For example, it may involved depositing a material on a sacrificial layer, or simply providing a silicon wafer on an insulator, such as the top layer of a silicon-on-insulator ("SOI") wafer.

In illustrative embodiments, the wet etch resistant material is a single, substantially contiguous apparatus, which is substantially completely removed by the process in a single act. Moreover, the wet etch resistant material may be unpatterned after the portion of wet etch resistant material is positioned between the diaphragm and the backplate.

The backplate may be formed from a number of different types of wafers, such as a part of a SOI wafer. As a further example, the sacrificial material may be formed from polysilicon or oxide.

Various processes may be executed to complete the microphone. For example, the method may form a first hole through the diaphragm, and a second hole through the sacrificial material. The second hole effectively produces a channel between a bottom surface of the diaphragm and a top surface of the backplate. To support the diaphragm, the portion of wet etch resistant material substantially fills the channel. In some embodiments, the wet etch resistant material substantially completely fills the first hole even when the sacrificial material is removed.

In accordance with another embodiment of the invention, a method of forming a MEMS microphone provides an SOI wafer having a top layer, forms a sacrificial material on the top layer of the SOI wafer, and forms a diaphragm on the sacrificial material. The method also forms a hole through the diaphragm, and a channel through the sacrificial material. The hole and channel are in fluid communication, and the channel exposes a bottom surface of the diaphragm and a top surface of the top layer of the SOI wafer. The method then adds a wet etch resistant material having a first portion within the channel and a second contiguous portion that is external to channel and substantially completely fills the hole through the diaphragm. At least a portion of the sacrificial material is removed before removing any of the wet etch resistant material.

The method eventually may release the diaphragm. To that end, the wet etch resistant material illustratively is removed after removing at least part of the sacrificial material. In some embodiments, the method removes a portion of the bottom and middle SOI layers to form a backside cavity. The method also may form a backplate hole through the top layer of the SOI wafer. Illustrative embodiments ensure that the wet etch resistant material is unpatterned after the wet etch resistant material is added to the channel.

In accordance with another embodiment of the invention, a MEMS microphone apparatus has a backplate, a diaphragm having a through-hole and top and bottom sides, and a substantially contiguous, unpatterned, wet etch resistant material, between the backplate and diaphragm. The material supports the diaphragm by being in contact with both the top and bottom sides of the diaphragm. In addition, the apparatus has an air space between portions of the diaphragm and the backplate.

In accordance with other embodiments of the invention, a method of forming a MEMS microphone provides a diaphragm layer on a sacrificial layer, where the sacrificial layer is between the diaphragm layer and a substrate. Next, the method forms a wet etch resistant material between the substrate and the diaphragm, and forms a backside cavity. The method then applies a wet etch material to the sacrificial material through the backside cavity to remove at least a portion of the sacrificial layer. At least a portion of the wet etch resistant material supports the diaphragm layer after applying the wet etch material.

In some embodiments, the diaphragm layer, sacrificial layer and substrate are respective layers of a single SOI wafer. Moreover, the act of providing may include depositing a material on the sacrificial layer to form the diaphragm.

BRIEF DESCRIPTION OF THE DRAWINGS

The foregoing advantages of the invention will be appreciated more fully from the following further description thereof with reference to the accompanying drawings wherein.

DESCRIPTION OF ILLUSTRATIVE EMBODIMENTS

In illustrative embodiments, a method of forming a microphone uses a liquid etch resistant material to prevent its diaphragm from adhering or otherwise sticking to its backplate during a liquid/wet etch step. To that end, the illustrative method forms a wet etch resistant material between the diaphragm and backplate, thus supporting the diaphragm during a wet etch step. Various embodiments eliminate patterning steps by ensuring that the liquid etch material is added and removed in relatively few steps (e.g., one or two steps for adding, and a single step for removing-no specialized patterning processes for the wet etch resistant material are necessary). Details of illustrative embodiments are discussed below.

Figure 1A:
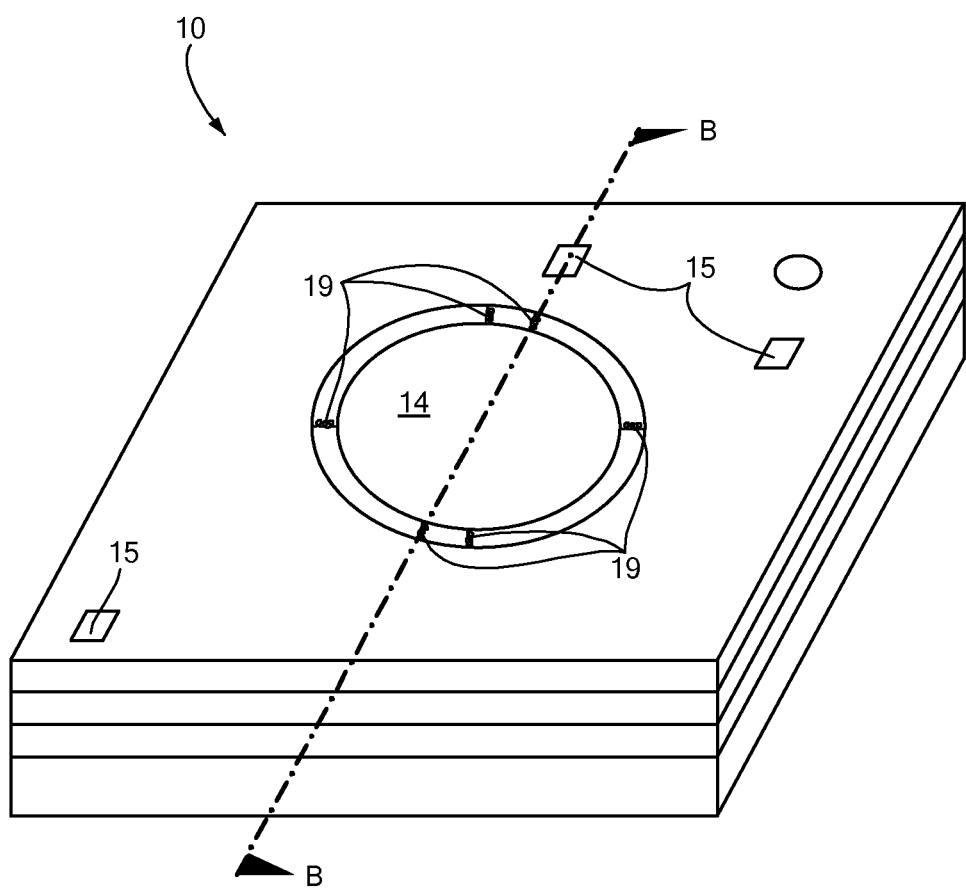
FIG. 1A schematically shows a perspective view of an unpackaged microphone that may be fabricated in accordance with illustrative embodiments of the invention.
Figure 1B:
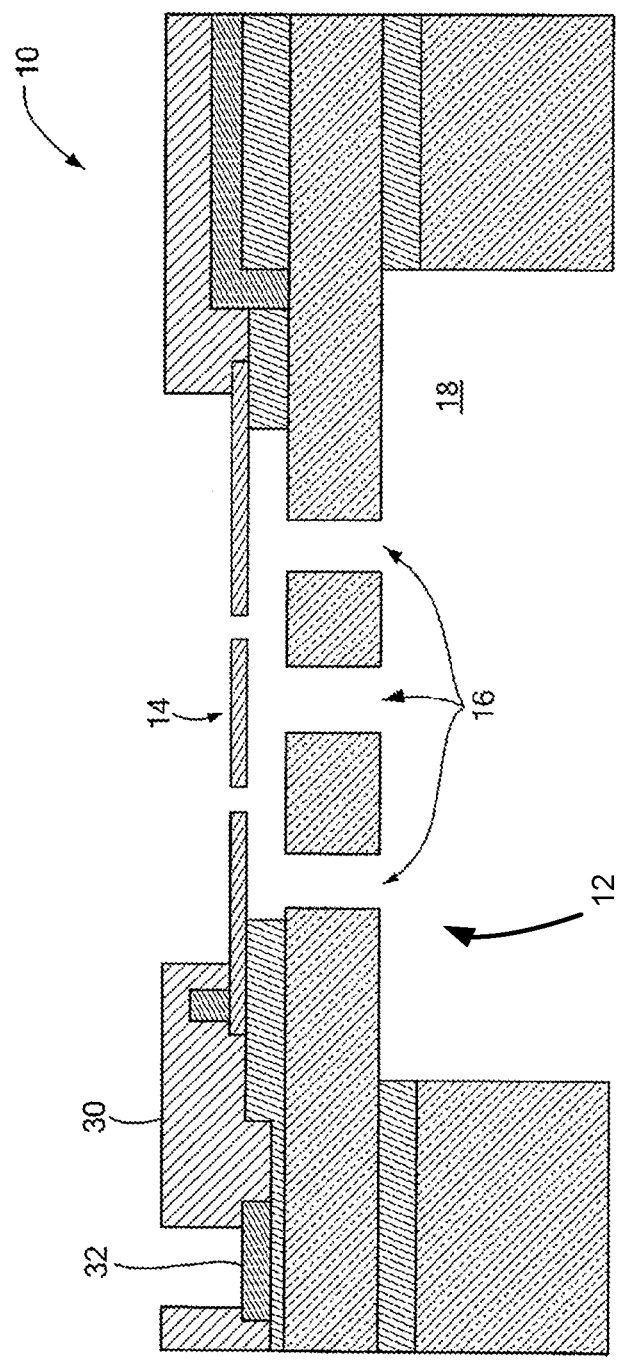
FIG. 1B schematically shows a cross-sectional view of the microphone shown in FIG. 1A.

FIG. 1A schematically shows a top, perspective view of a microphone 10 (also referred to as a "microphone chip 10") that may be fabricated in accordance with illustrative embodiments of the invention. FIG. 1B schematically shows a cross-section of the same microphone 10 across line B-B of FIG. 1A.

Among other things, the microphone 10 includes a static backplate 12 that supports and forms a capacitor with a flexible diaphragm 14. In illustrative embodiments, the backplate 12 is formed from single crystal silicon (e.g., the top layer of a silicon-on-insulator wafer), while the diaphragm 14 is formed from deposited polysilicon. Other embodiments, however, use other types of materials to form the backplate 12 and the diaphragm 14. For example, a single crystal silicon bulk wafer, or some deposited material may form the backplate 12. In a similar manner, a single crystal silicon bulk wafer, part of an silicon-on-insulator wafer, or some other deposited material may form the diaphragm 14. To facilitate operation, the backplate 12 has a plurality of through-holes 16 that lead to a backside cavity 18.

Springs 19 movably connect the diaphragm 14 to the static portion of the microphone 10, which includes the substrate. Audio signals cause the diaphragm 14 to vibrate, thus producing a changing capacitance. On-chip or off-chip circuitry (not shown) receive (via contacts 15) and convert this changing capacitance into electrical signals that can be further processed. It should be noted that discussion of the specific microphone 10 shown in FIGS. 1A and 1B is for illustrative purposes only. Other microphone configurations thus may be used with illustrative embodiments of the invention.

Figure 2A:
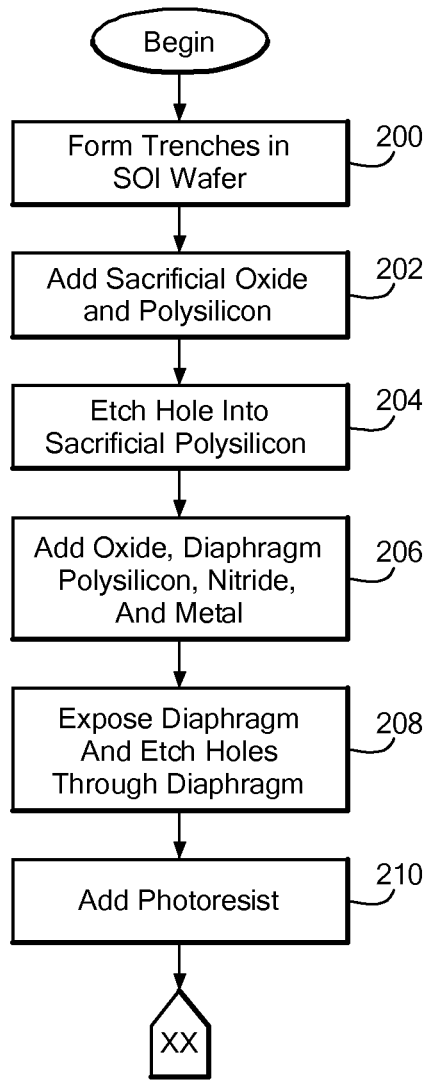
FIGS. 2A and 2B show a process of forming the microphone shown in FIGS. 1A and 1B in accordance with illustrative embodiments of the invention.
Figure 2B:
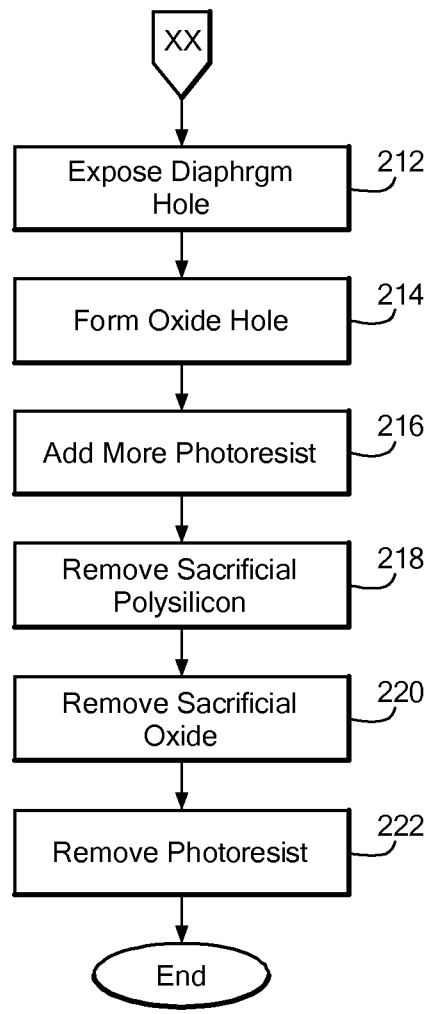

FIGS. 2A and 2B show a process of forming the microphone 10 shown in FIGS. 1A and 1B in accordance with illustrative embodiments of the invention. The remaining figures illustrate various steps of this process. It should be noted that this process does not describe all steps required for forming the microphone 10. Instead, it shows various relevant steps for forming the microphone 10. Accordingly, some steps are not discussed.

Figure 3A:
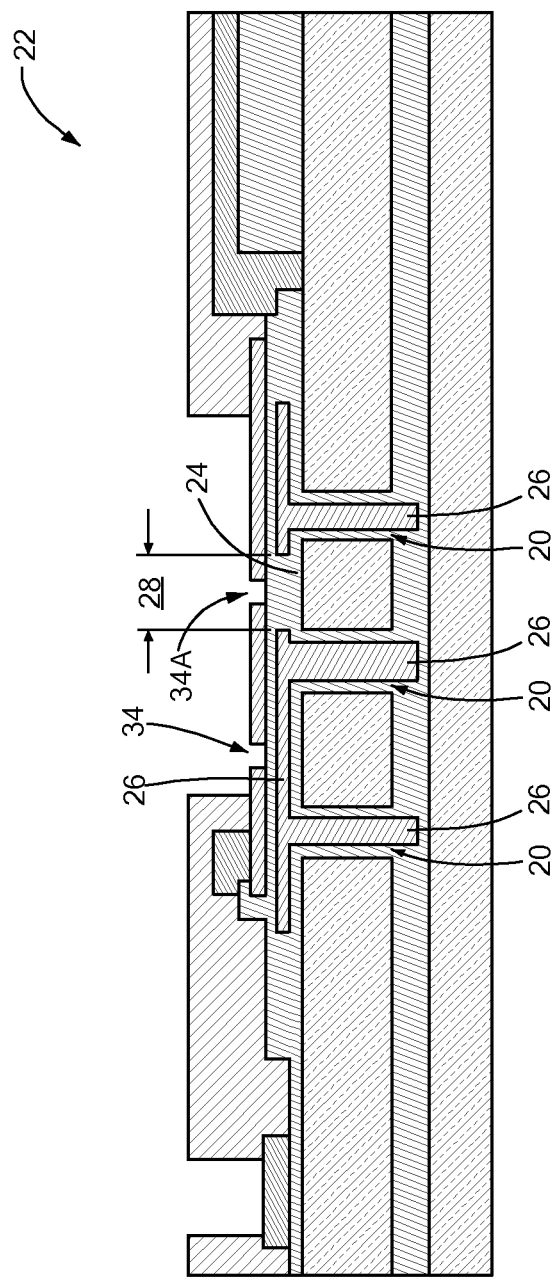
FIG. 3A schematically shows a view of the microphone during a stage of the method shown in FIG. 2A (steps 200-208).

The process begins at step 200, which etches trenches 20 in the top layer of a silicon-on-insulator wafer ("SOI wafer"). FIG. 3A schematically shows an intermediate apparatus 22 illustrating this step, as well as steps 202-208. Next, the process adds sacrificial oxide 24 to the walls of the trenches 20 and along at least a portion of the top surface of the top layer of the SOI wafer (step 202). Among other ways, this oxide 24 may be grown or deposited. Step 202 continues by adding sacrificial polysilicon 26 to the oxide lined trenches 20 and top-side oxide 24.

After adding the sacrificial polysilicon 26, the process etches a hole 28 into the sacrificial polysilicon 26 (step 204). The process then continues to step 206, which adds more oxide 24 to substantially encapsulate the sacrificial polysilicon 26. In a manner similar to other steps that add oxide 24, this oxide 24 essentially integrates with other oxides in which it comes into contact. Step 206 continues by adding an additional polysilicon layer that ultimately forms the diaphragm 14.

Nitride 30 for passivation and metal 32 for electrical connectivity also are added. For example, deposited metal may be patterned to form a first electrode for placing electrical charge on the diaphragm 14, another electrode for placing electrical charge on the backplate 12, and bond pads 15 for providing additional electrical connections. There may be electrical connections (not shown) between bond pads and the electrodes.

The process then both exposes the diaphragm 14, and etches holes 34 through the diaphragm 14 (step 208). As discussed below in greater detail, one of these holes ("diaphragm hole 34A") ultimately assists in forming a pedestal 42 that, for a limited time during this process, supports the diaphragm 14. A photoresist layer 36 then is added, completely covering the diaphragm 14 (step 210). This photoresist layer 36 serves the function of an etch mask.

Figure 3B:
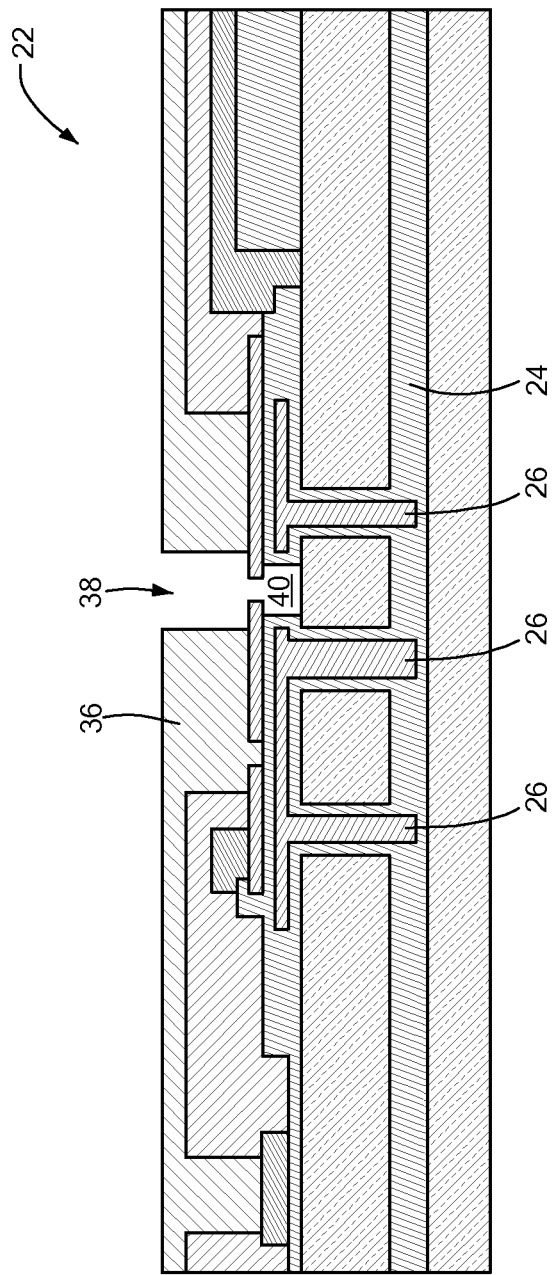
FIG. 3B schematically shows a view of the microphone during a stage of the method shown in FIG. 2A (step 214).

After adding the photoresist 36, the process exposes the diaphragm hole 34A (step 212, FIG. 3B). To that end, the process forms a hole ("resist hole 38") through the photoresist 36 by exposing that selected portion to light. This resist hole 38 illustratively has a larger inner diameter than that of the diaphragm hole 34A.

After forming the resist hole 38, the process forms a hole 40 through the oxide 24 (step 214, FIG. 3B). In illustrative embodiments, this oxide hole 40 effectively forms an internal channel that extends to the top surface of the upper SOI wafer.

It is expected that the oxide hole 40 first will have an inner diameter that is substantially equal to the inner diameter of the diaphragm hole 34A. A second step, such as an aqueous HF etch, may be used to enlarge the inner diameter of the oxide hole 40 to be greater than the inner diameter of the diaphragm hole 34A. This enlarged oxide hole diameter essentially exposes a portion of the bottom side of the diaphragm 14. In other words, at this point in the process, the channel forms an air space between the bottom side of the diaphragm 14 and the top surface of the backplate 12.

Also at this point in the process, the entire photoresist layer 36 may be removed to permit further processing. For example, the process may pattern the diaphragm 14, thus necessitating removal of the existing photoresist layer 36 (i.e., the mask formed by the photoresist layer 36). Other embodiments, however, do not remove this photoresist layer 36 until step 222 (discussed below).

Figure 3C:
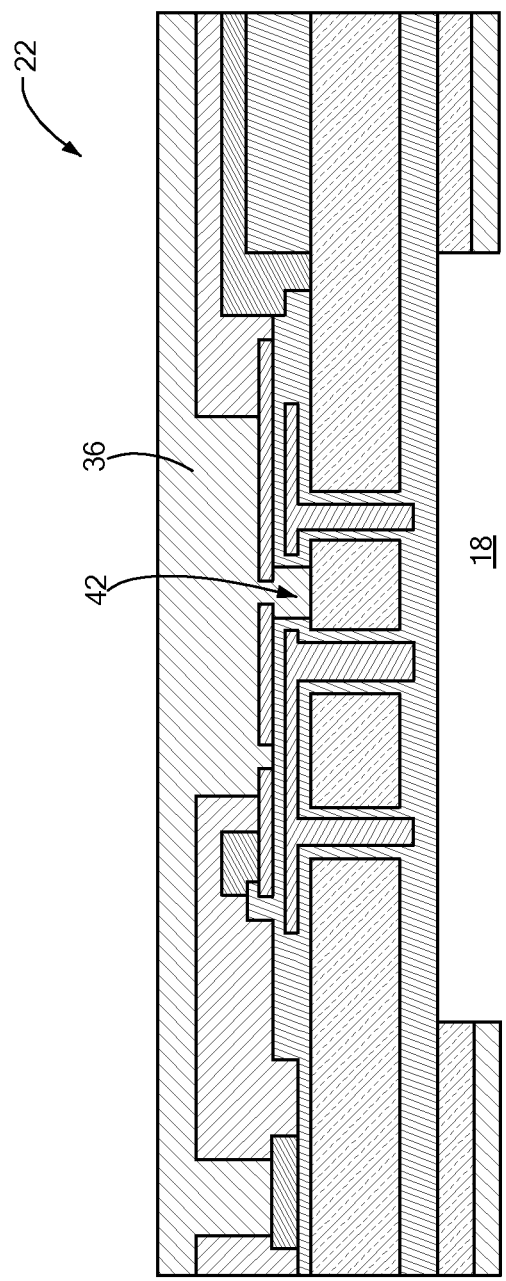
FIG. 3C schematically shows a view of the microphone during a stage of the method shown in FIG. 2A (step 216).

The process then continues to step 216, which adds more photoresist 36, to substantially fill the oxide and diaphragm holes 40 and 34 (FIG. 3C). The photoresist 36 filling the oxide hole 40 contacts the silicon of the top SOI layer, as well as the underside of the diaphragm 14 around the diaphragm hole 34A.

The embodiment that does not remove the original mask thus applies a sufficient amount of photoresist 36 in two steps (i.e., first the mask, then the additional resist to substantially fill the oxide hole 40), while the embodiment that removes the original mask applies a sufficient amount of photoresist 36 in a single step. In both embodiments, as shown in FIG. 3C, the photoresist 36 essentially acts as the single, substantially contiguous apparatus above and below the diaphragm 14. Neither embodiment patterns the photoresist 36 before the sacrificial layer is etched (i.e., removal of the sacrificial oxide 24 and polysilicon 26, discussed below).

In addition, the process may form the backside cavity 18 at this time. To that end, as shown in FIG. 3C, conventional processes may apply another photoresist mask on the bottom side of the SOI wafer to etch away a portion of the bottom SOI silicon layer. This should expose a portion of the oxide layer within the SOI wafer. A portion of the exposed oxide layer then is removed to expose the remainder of the sacrificial materials, including the sacrificial polysilicon 26.

Figure 3D:
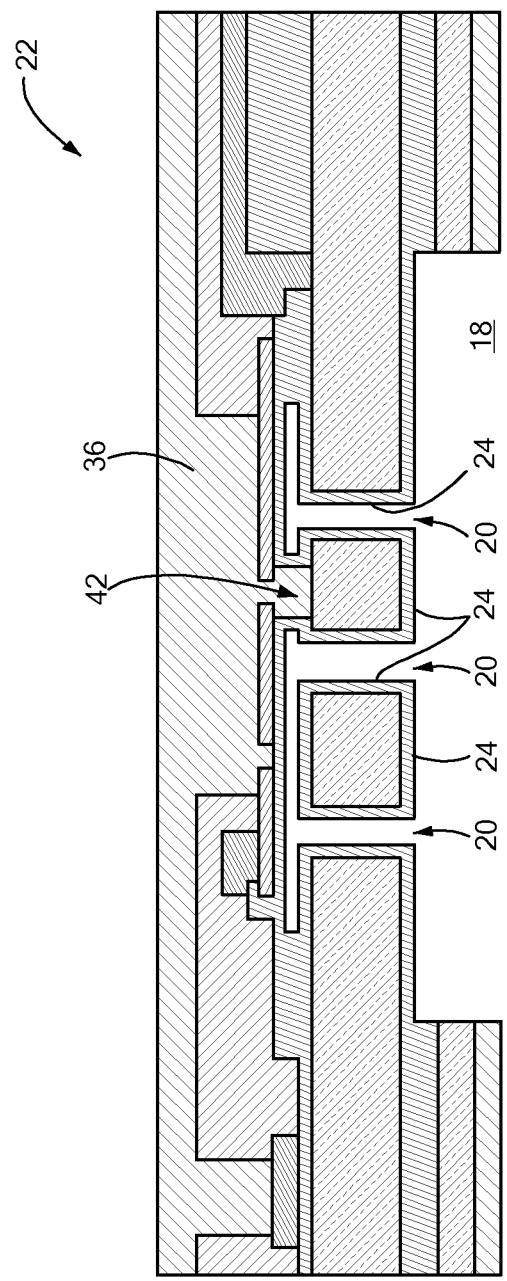
FIG. 3D schematically shows a view of the microphone during a stage of the method shown in FIG. 2A (step 218).

At this point, the sacrificial materials may be removed. To that end, the process removes the sacrificial polysilicon 26 (step 218, FIG. 3D) and then the sacrificial oxide 24 (step 220, FIG. 3E). Among other ways, illustrative embodiments remove the polysilicon 26 with a dry etch process (e.g., using xenon difluoride) through the backside cavity 18. In addition, illustrative embodiments remove the oxide 24 with a wet etch process (e.g., by placing the apparatus in an acid bath for a predetermined amount of time). Some embodiments, however, do not remove all of the sacrificial material. For example, such embodiments may not remove portions of the oxide 24. In that case, the oxide 24 may impact capacitance.

Figure 3E:
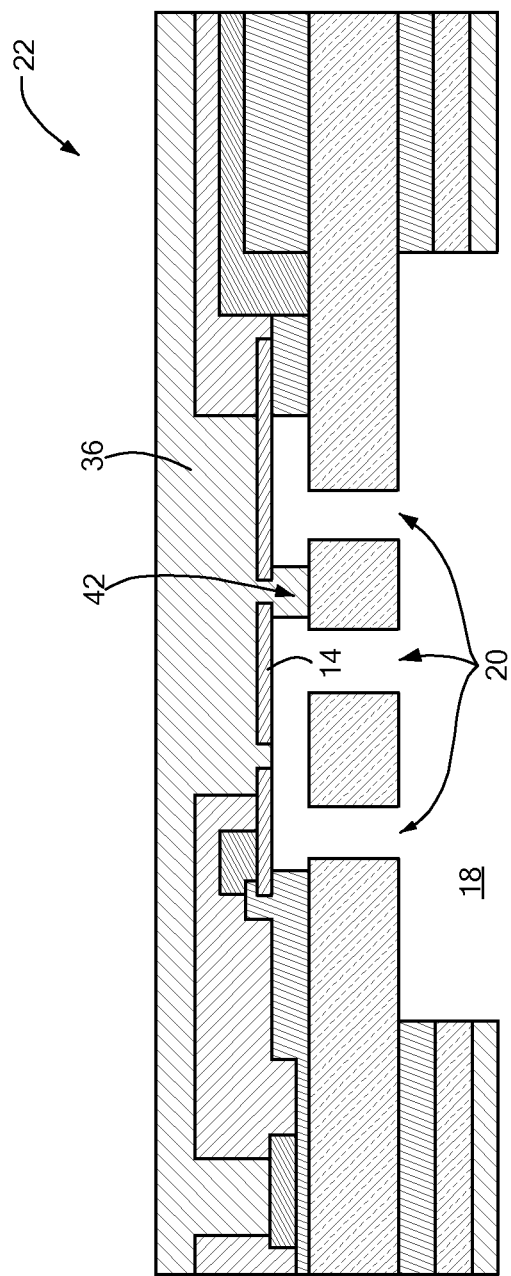
FIG. 3E schematically shows a view of the microphone during a stage of the method shown in FIG. 2A (step 220).

As shown in FIG. 3E, the photoresist 36 between the diaphragm 14 and top SOI layer supports the diaphragm 14. In other words, the photoresist 36 at that location forms a pedestal 42 that supports the diaphragm 14. As known by those skilled in the art, the photoresist 36 is substantially resistant to wet etch processes (e.g., aqueous HF process, such as those discussed above). It nevertheless should be noted that other wet etch resistant materials may be used. Discussion of photoresist 36 thus is illustrative and not intended to limit the scope of all embodiments.

Stated another way, a portion of the photoresist 36 is within an air space between the diaphragm 14 and the backplate 12; namely, it interrupts or otherwise forms a part of the boundary of the air space. In addition, as shown in the figures, this photoresist 36 extends as a substantially contiguous apparatus through the hole 34 in the diaphragm 14 and on the top surface of the diaphragm 14. It is not patterned before removing at least a portion of the sacrificial layers. No patterning steps are required to effectively fabricate the microphone 10.

To release the diaphragm 14, the process continues to step 222, which removes the photoresist 36/pedestal 42 in a single step. Among other ways, dry etch processes through the backside cavity 18 may be used to accomplish this step. This step illustratively removes substantially all of the photoresist 36—not simply selected portions of the photoresist 36.

It should be noted that a plurality of pedestals 42 may be used to minimize the risk of stiction between the backplate 12 and the diaphragm 14. The number of pedestals used is a function of a number of factors, including the type of wet etch resistant material used, the size and shape of the pedestals 42, and the size, shape, and composition of the diaphragm 14. Discussion of a single pedestal 42 therefore is for illustrative purposes.

It also should be noted that various embodiments of the present invention is not limited to any particular shape, material, or configuration of the microphone 10 or diaphragm 14. The microphone 10 may be, for example, round or square, solid or perforated by one or more holes, and/or flat or corrugated. Different diaphragm configurations might require different or additional processes from those described. For example, additional processes may be required to form holes or corrugations in the diaphragm 14.

Accordingly, stiction issues relating to surface tension of liquids should be mitigated because sacrificial layer removal processes using liquids are completed before the pedestal 42 is removed. Moreover, removing the sacrificial material through the backside cavity 18 favorably impacts microphone 10 performance by not requiring etch holes though the diaphragm 14 (to permit communication of the etching material). Specifically, as known by those in the art, it is preferable to have a diaphragm 14 with a large area to provide a stronger, more robust capacitive signal. Etching holes in the diaphragm 14 undesirably reduces the effective diaphragm area, thus reducing the effective signal. In addition, use of the backside cavity 18 eliminates the need to pattern the photoresist 36 used to support the diaphragm 14, consequently simplifying the fabrication process.

Although the above discussion discloses various exemplary embodiments of the invention, it should be apparent that those skilled in the art can make various modifications that will achieve some of the advantages of the invention without departing from the true scope of the invention.

What is claimed is:

1. A method of forming a microphone, the method comprising:
    forming a backplate by etching trenches into a layer of an silicon-on-insulator wafer, wherein the trenches have walls;
    lining the trenches by adding sacrificial wet etch removable material to the walls of the trenches and along at least a top portion of the silicon-on-insulator wafer;
    adding sacrificial polysilicon to the lined trenches and to the sacrificial wet etch removable material on the top portion of the silicon-on-insulator wafer;
    adding more sacrificial wet etch removable material to encapsulate the sacrificial polysilicon material;
    forming a flexible diaphragm on at least a portion of the wet etch removable sacrificial material;
    adding a wet etch resistant material, a portion of the wet etch resistant material being positioned between the diaphragm and the backplate to support the diaphragm;
    removing the sacrificial polysilicon;

removing the sacrificial wet etch removable material before removing any of the wet etch resistant material added by the act of adding wet etch resistant material; and removing the added wet etch resistant material after removing at least part of the wet etch removable sacrificial material.

2. The method as defined by claim 1 further comprising releasing the diaphragm, releasing comprising removing the sacrificial material and removing the wet etch resistant material.

3. The method as defined by claim 1 wherein the wet etch resistant material comprises a photoresist material.

4. The method as defined by claim 1, wherein the act of adding wet etch resistant material comprises:
forming a hole through the diaphragm;
forming a channel through the wet etch removable sacrificial material, the channel being in fluid communication with the hole through the diaphragm; and
adding wet etch resistant material, the wet etch resistant material filling the channel while the sacrificial material is removed.

5. The method as defined by claim 1 wherein adding wet etch resistant material includes adding a contiguous apparatus of wet etch resistant material, the contiguous apparatus of wet etch resistant material being removed by the act of removing the added wet etch resistant material.

6. The method as defined by claim 4, the method further comprising:
etching a hole in the sacrificial polysilicon before adding more sacrificial wet etch removable material to encapsulate the sacrificial polysilicon material; and
wherein the act of forming a channel through the wet etch removable material comprises forming a channel through the hole in the polysilicon.

7. The method as defined by claim 4, wherein the act of forming a hole through the diaphragm comprises:
adding a nitride layer above the diaphragm;
exposing the diaphragm;
forming a hole through the diaphragm;
adding a layer of photoresist above the diaphragm;
forming a resist hole in the layer of photoresist to expose the diaphragm hole.

8. The method as defined by claim 1 wherein the wet etch resistant material is unpatterned after the portion of wet etch resistant material is positioned between the diaphragm and the backplate.

9. The method as defined by claim 1 wherein the sacrificial wet etch removable material comprises oxide.

10. The method as defined by claim 1 further comprising:
forming a first hole through the diaphragm;
forming a second hole through the sacrificial material, the second hole producing a channel between a bottom surface of the diaphragm and a top surface of the backplate, the portion of wet etch resistant material filling the channel.

11. A method of forming a MEMS microphone, the method comprising:
providing an SOI wafer having a top layer;
forming a sacrificial material on the top layer of the SOI wafer;
forming a diaphragm on the sacrificial material;
adding wet etch resistant material covering the diaphragm;
forming a hole through the diaphragm;
forming a channel through the sacrificial material, the hole and channel being in fluid communication, the channel exposing a bottom surface of the diaphragm and a top surface of the top layer of the SOI wafer;
adding second wet etch resistant material having a first portion within the channel and a second portion contiguous with the first portion that is external to channel and substantially completely fills the hole through the diaphragm, such that the combination of the wet etch resistant material and the second wet etch resistant material is a contiguous apparatus above and below the diaphragm; and
removing at least a portion of the sacrificial material before removing any of the wet etch resistant material, wherein the wet etch resistant material is not removed before adding the second wet etch resistant material.

12. The method as defined by claim 11 further comprising releasing the diaphragm.

13. The method as defined by claim 11 further comprising removing the wet etch resistant material after removing at least part of the sacrificial material.

14. The method as defined by claim 11 wherein the SOI wafer also has a bottom layer and a middle layer between the top and bottom layers, the method further comprising removing a portion of the bottom layer and the middle layer to form a backside cavity.

15. The method as defined by claim 14 further comprising forming a backplate hole through the top layer of the SOI wafer.

16. The method as defined by claim 11 wherein the wet etch resistant material is unpatterned after the wet etch resistant material is added to the channel.

17. A method of forming a MEMS microphone, the method comprising:
providing a diaphragm layer on a sacrificial layer, the sacrificial layer being between the diaphragm layer and a substrate;
forming a wet etch material completely covering the diaphragm and between the substrate and the diaphragm;
forming a backside cavity;
applying a wet etch material to the sacrificial material through the backside cavity to remove at least a portion of the sacrificial layer before removing any of the formed or applied wet etch material, at least a portion of the wet etch material supporting the diaphragm layer after applying the wet etch material, the sacrificial layer comprising a layer of sacrificial polysilicon encapsulated in sacrificial oxide; and
removing the sacrificial polysilicon prior to removing the sacrificial oxide.

18. The method as defined by claim 17 wherein the diaphragm layer and the sacrificial layer are fabricated on a single SOI wafer, and the substrate is a layer of the single SOI wafer.

19. The method as defined by claim 17 wherein providing a diaphragm layer comprises depositing a material on the sacrificial layer to form the diaphragm.

* * * * *